US008516683B2

(12) United States Patent
Credelle et al.

(10) Patent No.: US 8,516,683 B2
(45) Date of Patent: Aug. 27, 2013

(54) METHODS OF MAKING A RADIO FREQUENCY IDENTIFICATION (RFID) TAGS

(75) Inventors: Thomas Lloyd Credelle, Morgan Hill, CA (US); Glenn Gengel, Hollister, CA (US); Roger Green Stewart, Morgan Hill, CA (US); William Hill Joseph, San Leandro, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 755 days.

(21) Appl. No.: 12/502,888

(22) Filed: Jul. 14, 2009

(65) Prior Publication Data

US 2009/0271973 A1    Nov. 5, 2009

Related U.S. Application Data

(60) Division of application No. 11/824,959, filed on Jul. 2, 2007, now Pat. No. 7,559,131, which is a continuation of application No. 11/188,149, filed on Jul. 22, 2005, now Pat. No. 7,260,882, which is a continuation of application No. 10/952,201, filed on Sep. 27, 2004, now Pat. No. 6,985,361, which is a division of application No. 10/464,031, filed on Jun. 17, 2003, now Pat. No. 6,816,380, which is a continuation of application No. 09/872,985, filed on May 31, 2001, now Pat. No. 6,606,247.

(51) Int. Cl.
*H01Q 13/00* (2006.01)
*H01Q 1/28* (2006.01)
*H01Q 9/28* (2006.01)

(52) U.S. Cl.
USPC .............. 29/600; 29/592.1; 29/601; 29/832; 340/572.7; 343/700 MS

(58) Field of Classification Search
USPC ............... 29/592.1–594, 600–601, 825–830, 29/832–834, 874, 882; 340/572.1–572.7; 343/700 MS, 873, 895; 361/736–737, 760
See application file for complete search history.

(56) References Cited

U.S. PATENT DOCUMENTS

| 2,551,591 A | 5/1951 | Foord |
| 3,024,151 A | 3/1962 | Robinson |

(Continued)

FOREIGN PATENT DOCUMENTS

| DE | 2810005 | 3/1978 |
| DE | 2810054 A1 | 9/1978 |

(Continued)

OTHER PUBLICATIONS

PCT Notification of Transmittal of International Search Report for PCT/US2004/09070, mailed on Feb. 10, 2005.

(Continued)

*Primary Examiner* — Minh Trinh
(74) *Attorney, Agent, or Firm* — Blakely, Sokoloff, Taylor & Zafman LLP

(57) ABSTRACT

Methods and apparatuses for an electronic assembly. The electronic assembly has a first object created and separated from a host substrate. The first object has a first electrical circuitry therein. A carrier substrate is coupled to the first object wherein the first object is being recessed below a surface of the carrier substrate. The carrier substrate further includes a first carrier connection pad and a second carrier connection pad that interconnect with the first object using metal connectors. A receiving substrate, which is substantially planar, including a second electrical circuitry, a first receiving connection pad, and a second receiving connection pad that interconnect with the second electrical circuitry using the metal connectors. The carrier substrate is coupled to the receiving substrate using the connection pads mentioned.

23 Claims, 6 Drawing Sheets

(56) References Cited

U.S. PATENT DOCUMENTS

| | | |
|---|---|---|
| 3,390,308 A | 6/1968 | Marley |
| 3,440,027 A | 4/1969 | Hugle |
| 3,458,382 A | 7/1969 | Buck |
| 3,689,991 A | 9/1972 | Airo |
| 3,708,860 A | 1/1973 | Bolster et al. |
| 3,724,737 A | 4/1973 | Rodnar |
| 3,891,157 A | 6/1975 | Justus |
| 3,903,590 A | 9/1975 | Yokogawa |
| 3,989,575 A | 11/1976 | Davies et al. |
| 4,331,957 A | 5/1982 | Enander et al. |
| 4,334,672 A | 6/1982 | Felix |
| 4,670,770 A | 6/1987 | Tai |
| 4,783,646 A | 11/1988 | Matsuzaki |
| 4,783,695 A | 11/1988 | Eichelberger et al. |
| 4,795,898 A | 1/1989 | Bernstein et al. |
| 4,818,855 A | 4/1989 | Mongeon et al. |
| 4,857,893 A | 8/1989 | Carroll |
| 4,918,811 A | 4/1990 | Eichelberger et al. |
| 4,937,653 A | 6/1990 | Blonder et al. |
| 4,957,776 A | 9/1990 | Higuchi et al. |
| 4,990,462 A | 2/1991 | Sliwa, Jr. et al. |
| 5,008,213 A | 4/1991 | Kolesar |
| 5,032,896 A | 7/1991 | Little et al. |
| 5,048,179 A | 9/1991 | Shindo et al. |
| 5,049,978 A | 9/1991 | Bates et al. |
| 5,055,968 A * | 10/1991 | Nishi et al. ............... 361/737 |
| 5,083,697 A | 1/1992 | Difrancesco |
| 5,099,227 A | 3/1992 | Geiszler et al. |
| 5,138,433 A | 8/1992 | Hiruta |
| 5,138,436 A | 8/1992 | Koepf |
| 5,188,984 A | 2/1993 | Nishiguchi |
| 5,205,032 A | 4/1993 | Kuroda et al. |
| 5,212,625 A | 5/1993 | van Andel et al. |
| 5,221,831 A | 6/1993 | Geiszler |
| 5,231,751 A | 8/1993 | Sachdev et al. |
| 5,241,456 A | 8/1993 | Marcinkiewicz et al. |
| D343,261 S | 1/1994 | Eberhardt |
| 5,298,685 A | 3/1994 | Bindra et al. |
| 5,353,498 A | 10/1994 | Fillion et al. |
| D353,343 S | 12/1994 | Eberhardt |
| 5,373,627 A | 12/1994 | Grebe |
| 5,378,880 A | 1/1995 | Eberhardt |
| 5,382,784 A | 1/1995 | Eberhardt |
| 5,382,952 A | 1/1995 | Miller |
| 5,420,757 A | 5/1995 | Eberhardt et al. |
| 5,422,513 A | 6/1995 | Marcinkiewicz |
| 5,430,441 A | 7/1995 | Bickley et al. |
| 5,434,751 A | 7/1995 | Cole, Jr. et al. |
| 5,435,057 A | 7/1995 | Bindra et al. |
| 5,444,223 A | 8/1995 | Blama |
| RE35,119 E | 12/1995 | Blonder et al. |
| 5,514,613 A | 5/1996 | Santadrea et al. |
| 5,517,752 A | 5/1996 | Sakata et al. |
| 5,528,222 A | 6/1996 | Moskowitz et al. |
| 5,545,291 A | 8/1996 | Smith et al. |
| 5,554,996 A | 9/1996 | Chatzipetros |
| 5,556,441 A | 9/1996 | Courtwright |
| 5,557,470 A | 9/1996 | Shibayama |
| 5,565,846 A | 10/1996 | Geiszler et al. |
| 5,574,470 A | 11/1996 | de Vall |
| D378,578 S | 3/1997 | Eberhardt |
| 5,612,254 A | 3/1997 | Mu et al. |
| 5,627,931 A | 5/1997 | Ackley et al. |
| 5,645,932 A | 7/1997 | Uchibori |
| 5,682,143 A | 10/1997 | Brady et al. |
| 5,707,902 A | 1/1998 | Chang et al. |
| 5,708,419 A | 1/1998 | Isaacson et al. |
| 5,715,594 A | 2/1998 | Patterson et al. |
| 5,735,040 A | 4/1998 | Ochi et al. |
| 5,745,984 A | 5/1998 | Cole, Jr. et al. |
| 5,754,110 A | 5/1998 | Appalucci et al. |
| 5,779,839 A | 7/1998 | Tuttle et al. |
| 5,783,856 A | 7/1998 | Smith et al. |
| 5,798,050 A | 8/1998 | Gaynes et al. |
| 5,818,348 A | 10/1998 | Walczak et al. |
| 5,824,186 A | 10/1998 | Smith et al. |
| 5,862,117 A | 1/1999 | Fuentes et al. |
| 5,880,934 A * | 3/1999 | Haghiri-Tehrani ........... 361/737 |
| 5,904,545 A | 5/1999 | Smith et al. |
| 5,910,770 A | 6/1999 | Ohara |
| 5,914,862 A | 6/1999 | Ferguson et al. |
| 5,995,006 A | 11/1999 | Walsh |
| 6,008,993 A * | 12/1999 | Kreft ............... 361/737 |
| 6,018,299 A | 1/2000 | Eberhardt |
| 6,019,284 A | 2/2000 | Freeman et al. |
| 6,031,450 A | 2/2000 | Huang |
| 6,040,773 A | 3/2000 | Vega et al. |
| 6,044,046 A | 3/2000 | Diezmann et al. |
| 6,064,116 A | 5/2000 | Akram |
| 6,078,791 A | 6/2000 | Tuttle et al. |
| 6,082,660 A | 7/2000 | Meyer |
| 6,091,332 A | 7/2000 | Eberhardt et al. |
| 6,094,138 A | 7/2000 | Eberhardt et al. |
| 6,094,173 A | 7/2000 | Nylander |
| 6,100,804 A | 8/2000 | Brady et al. |
| 6,107,920 A | 8/2000 | Eberhardt et al. |
| 6,122,492 A | 9/2000 | Sears |
| 6,133,833 A | 10/2000 | Sidlauskas et al. |
| 6,133,835 A | 10/2000 | De Leeuw |
| 6,134,130 A | 10/2000 | Connell et al. |
| 6,140,146 A | 10/2000 | Brady et al. |
| 6,147,605 A | 11/2000 | Vega et al. |
| 6,147,607 A | 11/2000 | Lynn |
| 6,147,662 A | 11/2000 | Grabau et al. |
| 6,164,551 A | 12/2000 | Altwasser |
| 6,181,287 B1 | 1/2001 | Beigel |
| 6,189,208 B1 | 2/2001 | Estes et al. |
| 6,194,119 B1 | 2/2001 | Wolk et al. |
| 6,195,858 B1 | 3/2001 | Ferguson et al. |
| 6,204,163 B1 | 3/2001 | Panchou et al. |
| 6,206,282 B1 | 3/2001 | Hayes, Sr. et al. |
| 6,211,572 B1 | 4/2001 | Fjelstad et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,229,442 B1 | 5/2001 | Rolin et al. |
| 6,236,316 B1 | 5/2001 | Eberhardt et al. |
| 6,246,327 B1 | 6/2001 | Eberhardt |
| 6,252,508 B1 | 6/2001 | Vega et al. |
| 6,259,408 B1 | 7/2001 | Brady et al. |
| 6,262,692 B1 | 7/2001 | Babb |
| 6,265,977 B1 | 7/2001 | Vega et al. |
| 6,268,796 B1 | 7/2001 | Gnadinger et al. |
| 6,271,801 B2 | 8/2001 | Tuttle et al. |
| 6,274,391 B1 | 8/2001 | Wachtler et al. |
| 6,274,508 B1 | 8/2001 | Jacobsen et al. |
| 6,275,156 B1 | 8/2001 | Rasband |
| 6,275,681 B1 | 8/2001 | Vega et al. |
| 6,280,544 B1 | 8/2001 | Fox et al. |
| 6,281,038 B1 | 8/2001 | Jacobsen et al. |
| 6,281,794 B1 | 8/2001 | Duan et al. |
| 6,282,407 B1 | 8/2001 | Vega et al. |
| 6,291,896 B1 | 9/2001 | Smith |
| 6,297,072 B1 | 10/2001 | Tilmans et al. |
| 6,309,912 B1 | 10/2001 | Chiou et al. |
| 6,313,747 B2 | 11/2001 | Imaichi et al. |
| 6,320,543 B1 | 11/2001 | Ohata et al. |
| 6,320,753 B1 | 11/2001 | Launay |
| 6,329,213 B1 | 12/2001 | Tuttle et al. |
| 6,329,917 B1 | 12/2001 | Leonard |
| 6,357,005 B1 | 3/2002 | Devaux et al. |
| 6,366,468 B1 | 4/2002 | Pan |
| 6,384,425 B1 | 5/2002 | Huber et al. |
| 6,392,213 B1 | 5/2002 | Martorana et al. |
| 6,395,373 B2 | 5/2002 | Conti et al. |
| 6,410,415 B1 | 6/2002 | Estes et al. |
| 6,417,025 B1 | 7/2002 | Gengel et al. |
| 6,420,266 B1 | 7/2002 | Smith et al. |
| 6,448,109 B1 | 9/2002 | Karpman |
| 6,451,154 B1 | 9/2002 | Grabau et al. |
| 6,459,084 B1 | 10/2002 | Boreman et al. |
| 6,459,588 B1 | 10/2002 | Morizumi et al. |
| 6,468,638 B2 | 10/2002 | Jacobsen et al. |
| 6,486,780 B1 | 11/2002 | Garber et al. |

| | | |
|---|---|---|
| 6,514,790 B1 | 2/2003 | Plettner et al. |
| 6,523,734 B1 | 2/2003 | Kawai et al. |
| 6,528,351 B1 | 3/2003 | Nathan et al. |
| 6,530,649 B1 | 3/2003 | Pan |
| 6,536,674 B2 | 3/2003 | Kayanakis et al. |
| 6,542,444 B1 | 4/2003 | Rütsche |
| 6,549,064 B2 | 4/2003 | Bandy et al. |
| 6,559,666 B2 | 5/2003 | Bernier et al. |
| 6,590,346 B1 | 7/2003 | Hadley et al. |
| 6,606,247 B2 | 8/2003 | Credelle et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,696,785 B2 | 2/2004 | Shimoda et al. |
| 6,727,970 B2 | 4/2004 | Grace et al. |
| 6,779,733 B2 | 8/2004 | Akita et al. |
| 6,780,696 B1 | 8/2004 | Schatz |
| 6,794,221 B2 | 9/2004 | Sayyah |
| 6,816,380 B2 | 11/2004 | Credelle et al. |
| 6,841,419 B2 | 1/2005 | Akita et al. |
| 6,844,673 B1 | 1/2005 | Bernkopf |
| 6,850,312 B2 | 2/2005 | Jacobsen et al. |
| 6,853,087 B2 | 2/2005 | Neuhaus et al. |
| 6,856,086 B2 | 2/2005 | Grace et al. |
| 6,863,219 B1 | 3/2005 | Jacobsen et al. |
| 6,864,570 B2 | 3/2005 | Smith et al. |
| 6,867,983 B2 | 3/2005 | Liu et al. |
| 6,908,295 B2 | 6/2005 | Thielman et al. |
| 6,919,680 B2 | 7/2005 | Shimoda et al. |
| 6,951,596 B2 | 10/2005 | Green et al. |
| 6,957,481 B1 | 10/2005 | Patrice |
| 6,985,361 B2 | 1/2006 | Credelle et al. |
| 7,014,729 B2 | 3/2006 | Grabau et al. |
| 7,017,807 B2 | 3/2006 | Kipp et al. |
| 7,045,186 B2 | 5/2006 | Grabau et al. |
| 7,046,328 B2 | 5/2006 | Jacobsen et al. |
| 7,102,520 B2 * | 9/2006 | Liu et al. ............ 340/572.1 |
| 7,113,250 B2 | 9/2006 | Jacobsen et al. |
| 7,120,987 B2 | 10/2006 | Liu et al. |
| 7,158,037 B2 | 1/2007 | Forster et al. |
| 7,236,093 B2 | 6/2007 | Stromberg |
| 7,260,247 B2 | 8/2007 | Kita |
| 7,260,882 B2 | 8/2007 | Credelle et al. |
| 7,298,330 B2 | 11/2007 | Forster et al. |
| 7,353,598 B2 | 4/2008 | Craig et al. |
| 7,361,251 B2 | 4/2008 | Green et al. |
| 7,368,032 B2 | 5/2008 | Green et al. |
| 7,559,131 B2 * | 7/2009 | Credelle et al. ............ 29/600 |
| 2001/0000631 A1 | 5/2001 | Zandman et al. |
| 2001/0028308 A1 | 10/2001 | De La Huerga |
| 2001/0030628 A1 | 10/2001 | Brady et al. |
| 2001/0031514 A1 | 10/2001 | Smith |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith |
| 2002/0097664 A1 | 7/2002 | Ono |
| 2002/0114587 A1 | 8/2002 | Golwalkar et al. |
| 2002/0127864 A1 | 9/2002 | Smith et al. |
| 2002/0149107 A1 | 10/2002 | Chang et al. |
| 2002/0167450 A1 | 11/2002 | Korden et al. |
| 2003/0007421 A1 | 1/2003 | Niemiec et al. |
| 2003/0029921 A1 | 2/2003 | Akita et al. |
| 2003/0034400 A1 | 2/2003 | Han et al. |
| 2003/0036249 A1 | 2/2003 | Bauer et al. |
| 2003/0054881 A1 | 3/2003 | Hedrick et al. |
| 2003/0089444 A1 | 5/2003 | Melzer et al. |
| 2003/0112192 A1 | 6/2003 | King et al. |
| 2003/0121986 A1 | 7/2003 | Stromberg et al. |
| 2003/0136503 A1 | 7/2003 | Green et al. |
| 2003/0148555 A1 | 8/2003 | Akita et al. |
| 2003/0232174 A1 | 12/2003 | Chang et al. |
| 2004/0037053 A1 | 2/2004 | Akita et al. |
| 2004/0052202 A1 | 3/2004 | Brollier |
| 2004/0052203 A1 | 3/2004 | Brollier |
| 2004/0054594 A1 | 3/2004 | Forster et al. |
| 2004/0089408 A1 | 5/2004 | Brod et al. |
| 2004/0142766 A1 | 7/2004 | Savarese et al. |
| 2005/0070375 A1 | 3/2005 | Savarese et al. |
| 2005/0093678 A1 | 5/2005 | Forster et al. |
| 2005/0200539 A1 | 9/2005 | Forster et al. |
| 2005/0276210 A1 | 12/2005 | Reiter et al. |
| 2006/0012527 A1 | 1/2006 | Kai et al. |
| 2006/0022287 A1 | 2/2006 | Itoi et al. |
| 2006/0202830 A1 | 9/2006 | Scharfeld et al. |
| 2006/0210769 A1 | 9/2006 | Swindlehurst et al. |
| 2007/0031992 A1 | 2/2007 | Schatz |
| 2008/0197042 A1 | 8/2008 | Ullrich |
| 2008/0223936 A1 | 9/2008 | Mickle et al. |

FOREIGN PATENT DOCUMENTS

| | | |
|---|---|---|
| DE | 3203943 | 8/1983 |
| DE | 8709503 | 12/1987 |
| DE | 4427309 | 8/1994 |
| DE | 19534480 | 9/1994 |
| DE | 19745648 | 10/1997 |
| DE | 19840226 | 3/2000 |
| DE | 19929610 C1 | 10/2000 |
| DE | 10017431 | 10/2001 |
| EP | 0277606 | 8/1988 |
| EP | 0450950 | 10/1991 |
| EP | 0498703 | 8/1992 |
| EP | 0952543 | 10/1999 |
| EP | 0992939 A1 | 4/2000 |
| EP | 1014302 A1 | 6/2000 |
| EP | 1035418 | 9/2000 |
| EP | 1035503 | 9/2000 |
| EP | 1039543 | 9/2000 |
| EP | 1111537 | 6/2001 |
| EP | 1167068 | 1/2002 |
| EP | 1302893 | 4/2006 |
| EP | 1843280 A1 | 10/2007 |
| FR | 2806029 | 3/2000 |
| GB | 2341166 | 3/2000 |
| JP | 10256429 | 9/1999 |
| JP | 11250207 | 9/1999 |
| JP | 11353439 | 12/1999 |
| JP | 2000231614 | 8/2000 |
| JP | 2001175837 | 6/2001 |
| WO | WO 88/02549 | 4/1988 |
| WO | WO 98/15981 | 4/1998 |
| WO | WO 98/54681 | 12/1998 |
| WO | WO 99/41701 A2 | 8/1999 |
| WO | WO 99/41721 | 8/1999 |
| WO | WO 99/65002 | 12/1999 |
| WO | WO 00/14789 | 3/2000 |
| WO | WO 00/16493 | 3/2000 |
| WO | WO 00/23994 | 4/2000 |
| WO | WO 00/52109 | 9/2000 |
| WO | WO 01/02060 | 1/2001 |
| WO | WO 01/33621 A2 | 5/2001 |
| WO | WO 01/54058 | 7/2001 |
| WO | WO 01/61646 | 8/2001 |
| WO | WO 01/62517 | 8/2001 |
| WO | WO 01/75789 A1 | 10/2001 |
| WO | WO 01/95241 | 12/2001 |
| WO | WO 01/95252 | 12/2001 |
| WO | WO 02/49093 A1 | 6/2002 |
| WO | WO 02/089051 | 11/2002 |
| WO | WO 02/097724 A1 | 12/2002 |
| WO | WO 03/063211 | 7/2003 |
| WO | WO 03/105063 | 12/2003 |
| WO | WO 2004/006259 A1 | 1/2004 |
| WO | WO 2004/097731 A2 | 11/2004 |

OTHER PUBLICATIONS

PCT/US2004/09070, The Written Opinion of the International Searching Authority, mailed on Feb. 10, 2005.
PCT Notification of Transmittal of International Search Report and the Written Opinion of the International Searching Authority, or the Declaration for PCT/US2005/040772, mailed on Jul. 26, 2006 (15 pages).
PCT Search Report PCT/US00/02348 mailed Apr. 5, 2000; 7 pages.

PCT Written Opinion Report, PCT Application No. PCT US2005/002534. Mailed Nov. 11, 2005 (7 pages).
Scrupski, S.E., "Ics on Film Strip Lead Themselves to Automatic Handling by Manufacturer and User, Too", Electronics, Feb. 1, 1971, ages 44-48, total 5 pages.
Van Der Drift, et al. PhilipsTechnical Review, "Integrated Circuits with Leads on Flexiable Tape" vol. 34(4), 1974 pp. 85-95, 11 pages.
PCT International Search Report for PCT/US2003/02115, mailed Jul. 1, 2003.
PCT/US2005/040772, Invitation to Pay Additional Fees/Partial International Search mailed Mar. 27, 2006.
PCT/US00/02348, International Preliminary Report on Patentability dated May 15, 2002.
Electronics Review, Electronics, Jul. 24, 1967, pp. 36-28, 3 pages.
Gilleo, K, Handbook of Flexible Circuits, Chpt 2, Chpt 7, (1992) 11 pages.
Grossman, S.E. "Film-Carrier Technique Automates the Packaging of IC Chips" May 16, 1974, pp. 89-95, 7 pages.
Hannke, Bittner & Partner, Opposition to the Grant of EP1470528, filed with the EPO, dated Feb. 16, 2007.
IPRP Chapter 1, PCT Application No. PCT/US2004/009070, (7 pages) mailed Oct. 13, 2005.
IPRP Chapter 1, PCT Application No. PCT/US2005/002534, (9 pages) mailed Aug. 10, 2006.
Kriebel, Frank (2005). RFID Chip and Tag Assembly Challenges: Low Cost RFID IC Packaging and Assembly Workshop, Nov. 14, 2005, Munich, Germany. (12 pgs).
Patstone, W., EDN, "Tape-Carrier packaging Boasts Almost Unlimited Potential" Oct. 1974, A Cahners Publication, 8 pages.
PCT International Search Report, PCT Application No. PCT US2005/002534. Mailed Nov. 11, 2005, 7 pages.
PCT International Search Report for PCT Application No. PCT US02/16474. Mailed Oct. 2002.
PCT International Written Opinion, PCT Application No. PCT US03/02115, (4 pages).
PCT Notification of Concerning Transmittal of International Preliminary Report on Patentability (Chapter 1 of the Patent Cooperation Treaty) for PCT/US2005/040772, mailed on May 31, 2007 (8 pages).
PCT Notification of Transmittal of International Preliminary Examination report for PCT Application No. PCT US02/16474. Mailed Jul. 21, 2005 (5 pages).

* cited by examiner

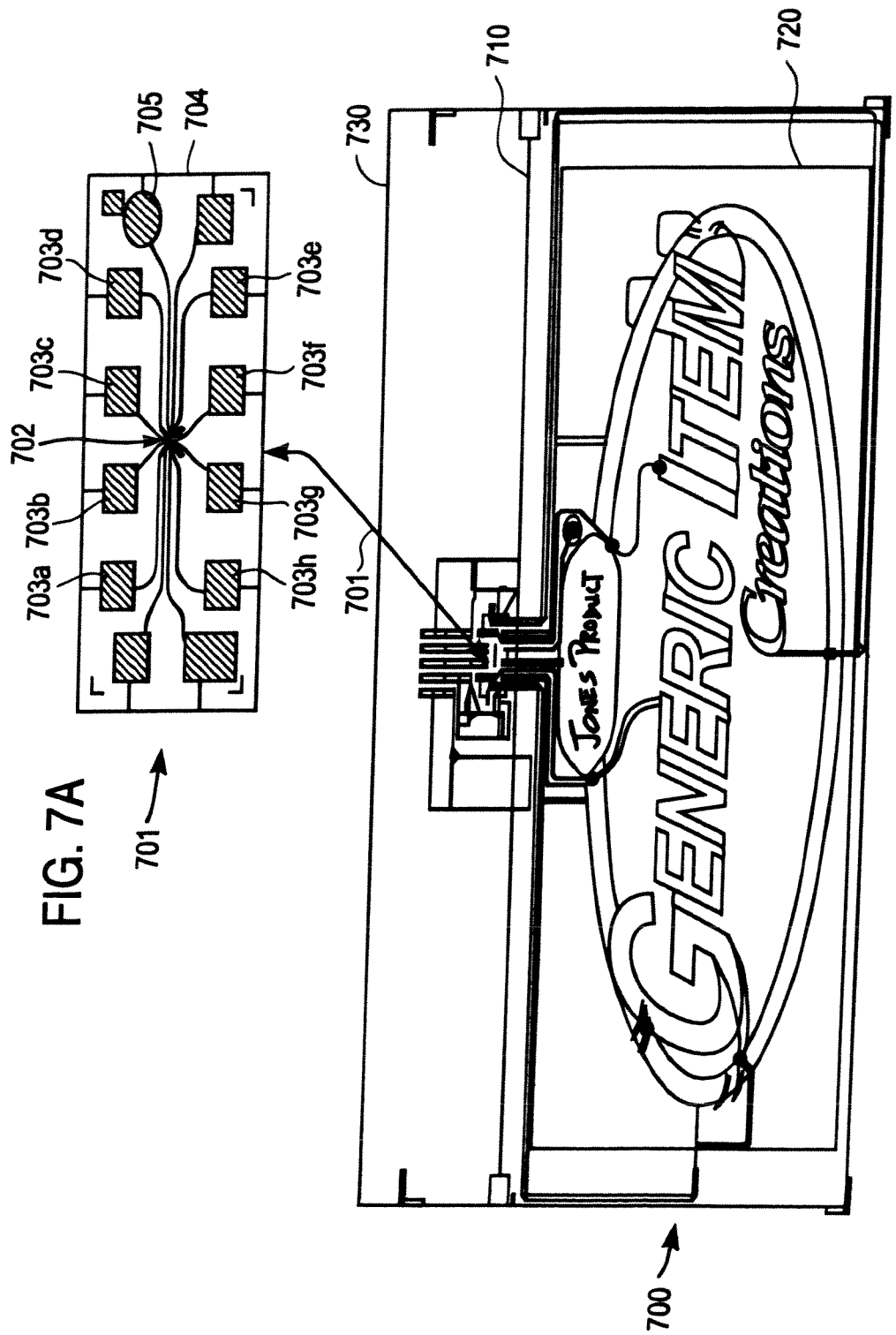

METHODS OF MAKING A RADIO FREQUENCY IDENTIFICATION (RFID) TAGS

RELATED APPLICATIONS

This is a Divisional of U.S. patent application Ser. No. 11/824,959, filed on Jul. 2, 2007, now U.S. Pat. No. 7,559,131, which is a Continuation Application of U.S. patent application Ser. No. 11/188,149, filed on Jul. 22, 2005, now U.S. Pat. No. 7,260,882, which is a Continuation application Ser. No. 10/952,201, filed on Sep. 27, 2004, now U.S. Pat. No. 6,985,361, which is a Divisional Application of U.S. patent application Ser. No. 10/464,031, filed on Jun. 17, 2003, now U.S. Pat. No. 6,816,380, which is a continuation of U.S. patent application Ser. No. 09/872,985, filed on May 31, 2001, now U.S. Pat. No. 6,606,247.

FIELD OF THE INVENTION

The present invention relates generally to the field of fabricating electronic devices with small functional elements depositing in various substrates and apparatuses comprising these electronic devices.

BACKGROUND OF THE INVENTION

There are many examples of functional elements or components which can provide, produce, or detect electromagnetic signals or other characteristics. An example of using the functional components is using them as an array of a display drivers in a display where many pixels or sub-pixels are formed with an array of electronic elements. For example, an active matrix liquid crystal display includes an array of many pixels or sub-pixels which are fabricated using amorphous silicon or polysilicon circuit elements. Additionally, a billboard display or an signage display such as store displays and airport signs are also among the many electronic devices employing these functional components.

Functional components have also been used to make other electronic devices. One example of such use is that of a radio frequency (RF) identification tag (RFID tag) which contains a chip or several chips that are formed with a plurality of electronic elements. Information is recorded into these chips, which is then transferred to a base station. Typically, this is accomplished as the RFID tag, in response to a coded RF signal received from the base station, functions to cause the tag to reflect the incident RF carrier back to the base station thereby transferring the information.

Demand for functional components has expanded dramatically. Clearly, the functional components have been applied to make many electronic devices, for instance, the making of microprocessors, memories, power transistors, super capacitors, displays, x-ray detector panels, solar cell arrays, memory arrays, long wavelength detector array, phased arrays of antennas, or the like. The growth for the use of functional components, however, has been inhibited by the high cost of assembling the functional components into other substrates.

For instance, functional components such as semiconductor chips having RF circuit, logic and memory have been incorporated into an RFID tag. The tag also has an antenna, and a collection of other necessary components such as capacitors or battery, all mounted on a substrate and sealed with another layer of material. Often the assembling of these components requires complex and multiple processes thereby causing the price of the end product to be expensive. Further, the manufacturing of these RFID tag is costly because of inefficient and wasteful use of the technologies and the materials used to make these products under the current method.

Depositing semiconductor chips and other components onto substrates having the antenna is complex and tedious. The antenna material can be a thin film metal which can be deposited on substrates. Alternatively, the antenna material can also be adhered to the substrates using adhesive. These substrate are large compared to these semiconductor chip. The semiconductor chips to be interconnected to the antenna thus must be made large enough to allow for the interconnection. Because the semiconductor chips need to be large, material costs are thus high. Further, if there is a defective chip, the whole RFID tag would be defective and would not be discovered until the whole assembly is complete. Then, the whole RFID tag is disposed along with other good components. This is intrinsically wasteful and inefficient.

The functional components may also be incorporated into substrates to make displays such as flat panel displays, liquid crystal displays (LCDs), active matrix LCDs, and passive matrix LCDs. Making LCDs has become increasingly difficult because it is challenging to produce LCDs with high yields. Furthermore, the packaging of driver circuits has become increasingly difficult as the resolution of the LCD increases. The packaged driver elements are also relatively large and occupy valuable space in a product, which results in larger and heavier products.

Furthermore, large displays such as those for signage purposes are expensive to make. Large displays are often made out of material with large-feature-size patterns that must be connected to integrated circuits (ICs) with small feature sizes. the This results in expensive packages that are bulky and expensive.

In general, these functional components include semiconductors that are manufactured on silicon wafers and then are packaged in thick chip carriers. These chip carriers, such as leaded chip packages, Tape Automated Bonded (TAB) carrier or flip chip carriers are bulky and expensive. Alternatively, integrated circuits incorporating into functional micro blocks can be used. These blocks and their functional components have been invented and disclosed in a copending U.S. patent application Ser. No. 09/251,220 which was filed Feb. 16, 1999 by the inventor John Stephen Smith and which is entitled "Functionally Symmetric Integrated Circuit Die." This application has been issued as U.S. Pat. No. 6,291,896 on Sep. 18, 2001. This patent is hereby incorporated herein by reference.

SUMMARY OF THE INVENTION

The present invention provides methods and apparatuses for an electronic assembly. According to one embodiment, the electronic assembly has a first object created and separated from a host substrate. The functional object has a first electrical circuitry therein. A carrier substrate is coupled to the first object wherein the first object is being recessed below a surface of the carrier substrate. The carrier substrate further includes a first carrier connection pad and a second carrier connection pad that interconnect with the first object using metal connectors. A receiving substrate, which is substantially planar, including a second electrical circuitry, a first receiving connection pad, and a second receiving connection pad that interconnect with the second electrical circuitry using the metal connectors. The carrier substrate is coupled to the receiving substrate. This coupling is achieved through couplings of the first receiving connection pad to the first carrier connection pad and the second receiving connection pad to the second carrier connection pad. An electrical connection between the first electrical circuitry and the second electrical circuitry is established.

BRIEF DESCRIPTION OF THE DRAWINGS

FIGS. 7A-B illustrate an exemplary embodiment of a signage display having the IC included in the flexible strap.

DETAILED DESCRIPTION OF THE INVENTION

Figure 1:
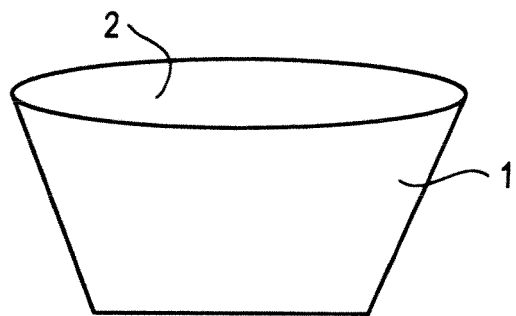
FIG. 1 illustrates an example of a functional component block.

FIG. 1 illustrates an exemplary embodiment of an object that is functional component block 1. Block 1 has a top surface 2 upon which a circuit element is situated (not shown). The circuit element on the top surface 2 may be an ordinary integrated circuit (IC) for any particular function. For example, the IC may be designed to drive a pixel of a display. The IC may also be designed to receive power from another circuit for the operation of a passive RFID tag. Alternatively, the IC may be designed to receive power from an energy source (e.g. battery) for the operation of an active RFID tag. In one embodiment, block 1 has a trapezoidal cross-section where the top of the block is wider than the bottom of the block 1. Block 1 may be created from a host substrate and separated from this substrate. This method of making block 1 can be found in the method described in copending U.S. patent application Ser. No. 09/251,220 now U.S. Pat. No. 6,291,896 referenced above. This patent is hereby incorporated by reference.

Figure 2:
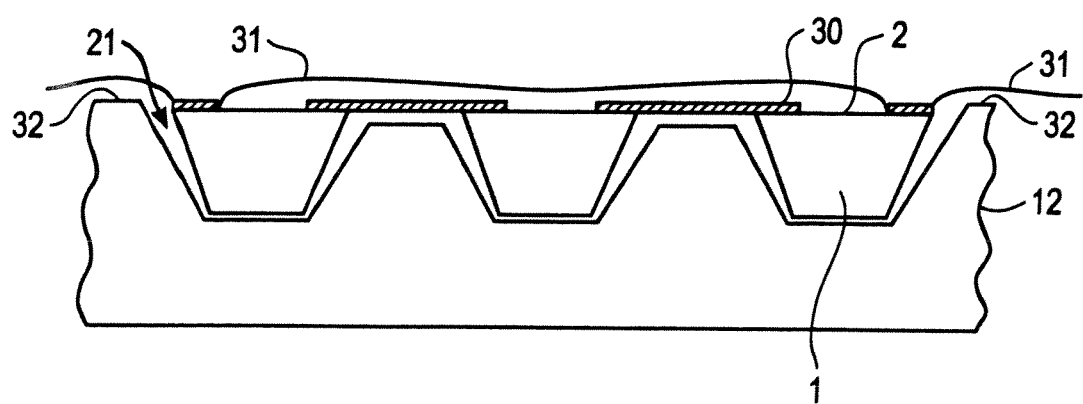
FIG. 2 illustrates an exemplary embodiment of a carrier substrate having the functional components blocks inserted therein.

FIG. 2 illustrates an exemplary embodiment in which block 1 is deposited in a recessed region of a carrier substrate 12. Once deposited, the block 1 is recessed below a surface 32 of the carrier substrate 12. The surface 32 of the carrier substrate 12 is the native surface of the substrate before any deposition of any other materials on top of the surface 32. Carrier substrate 12 may be a flexible substrate made out of plastic, fabric, metal, or some other suitable materials. In a preferred embodiment, carrier substrate 12 is flexible. FIG. 2 shows a planar view of a web material of carrier substrate 12 having recessed regions or holes 21 therein. These recessed regions or holes 21 may be created by a variety of methods. For example, the regions or holes 21 may be created by a web wheel, roller, or template, that have protruding structures as described in U.S. patent application Ser. No. 09/270,165, entitled "Apparatuses and Methods for Forming Assemblies" by Jeffrey Jay Jacobsen. This patent application is hereby incorporated by reference. Another method involves using a template having blocks wherein the blocks are pressed into web material making recessed regions or holes 21 into the web material of carrier substrate 12. (See U.S. patent application Ser. No. 09/270,157, entitled "Methods for Transferring Elements From a Template to a Substrate" describing the donor transfer method).

The blocks 1 may be deposited into the recessed regions or holes 21 of a carrier substrate 12 by a method described in U.S. Pat. No. 5,545,291. The block 1 is then being recessed within the carrier substrate 12 and below the surface 32 of the carrier substrate 12. The U.S. Pat. No. 5,545,291 explained how to assemble microstructures onto a substrate, and it is thus, incorporated herein by reference. This process may be referred to as FSA (fluidic self assembly) and may be performed with a web material such as the web material for carrier substrate 12. In one embodiment, a web material is advanced through a web process apparatus. The FSA process deposits a plurality of blocks onto the web material wherein the blocks fall into recessed regions found in the web material.

FIG. 2 also shows a planar view of the web material of carrier substrate 12 wherein the blocks 1 are seated in the recessed regions or holes 21. In one embodiment, electrical interconnect 30 is deposited onto the carrier substrate 12 interconnecting the top surface 2 of each block 1 to each other. Here, the web material of carrier substrate 12 is advanced to a further point in the FSA process wherein an interconnect layer is deposited thereon. The interconnect 30 may be comprised of conductive polymers, metals (e.g., aluminum, copper, silver, gold, etc.), metal particles, conductive organic compounds, or conductive oxides.

An insulation layer 31, which is a dielectric material, may be coated over the area that have the interconnect 30 to prevent short circuit with other functional components that the carrier substrate 12 may come into contact with. The insulation layer 31 insulates the circuit elements within the block 1 as well as the interconnect 30 that connects one block 1 to another block 1. The insulation layer 31 enables the carrier substrate 12 to cross over at least one electrical interconnection (e.g., another interconnect 30 on another substrate, or an antenna loop) without shorting out the whole device.

The interconnect 30 may be flexible interconnect layers (not shown). These interconnect layers may be made with the techniques used to create Tape Automated Bonding (TAB) tape interconnections well practiced in the semiconductor industry. The flexible interconnect layers may be created from one of numerous types of materials which are appropriate for a web tape material which is designed to hold electrically conductive interconnect layers. These materials include polyimide tapes on which are deposited conductive traces of metal. The metal may be deposited directly on the tape (e.g. by a blanket deposition) and then patterned by etching, or a photoresist layer may be applied and patterned, leaving grooves into which metal may be deposited. The interconnect may be patterned to create an intricate wiring pattern such as row and/or column interconnects for an active matrix display backplane. The actual patterns will depend on the particular application for these functional components. The flexible interconnect layer, once created, may be applied to the carrier substrate 12.

It will be appreciated that the flexible interconnect layer may be fabricated in a web process and then aligned with the web material of carrier substrate 12 having blocks 1 either in a web process or outside of a web process. It will be further appreciated that the carrier substrate may be flexible, planar, or rigid and made in a web process or batch process. It will also be appreciated that an alignment operation, using conventional techniques, may be necessary to properly align the interconnect layer 30 relative to the carrier substrate 12 with blocks when the interconnect layer is coupled to the carrier substrate 12.

In one embodiment, the process of interconnecting the functional components (e.g., blocks 1) embedded in a substrate (e.g., carrier substrate 12) uses only a single layer of metalization for interconnect layer 30. This will reduce the possibility of interlayer shorts on the electronic devices.

Figure 3:
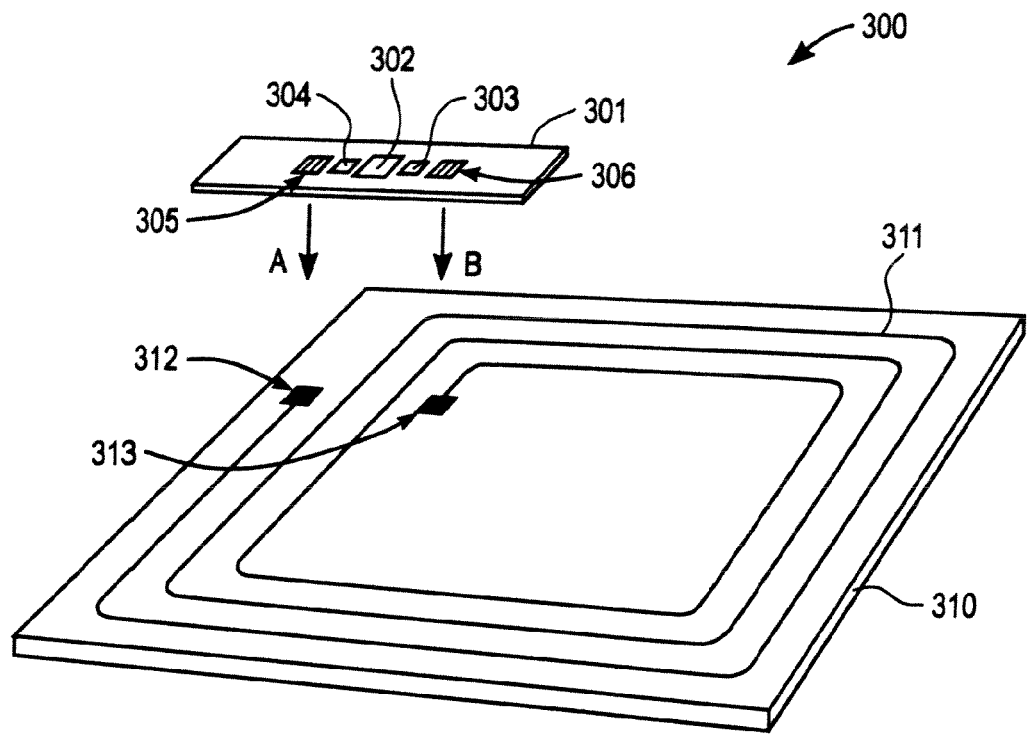
FIG. 3 illustrates a planar view of an exemplary embodiment of an RFID tag according to the present invention.

FIG. 3 illustrates an exemplary embodiment of an RFID tag 300. In this embodiment, a flexible carrier strap 301 comprising functional components is coupled to a receiving substrate 310, also comprising functional components. The flexible strap 301 may be the carrier substrate 12 discussed in FIG. 2 above. The flexible strap 301 comprises at least one functional component 302. The functional component 302 is much like the functional component block 1 of FIG. 1. The flexible strap 301 also may comprise other necessary components 303 and 304 such as a resistor, a capacitor or an inductor for completing the necessary circuitry. Components 303 and 304 may also be manufactured as blocks 1 above. Components 302, 303 and 304 may be interconnected, typically, through metal connectors such as metal wires, thin evaporated layer of conductor material (e.g., Aluminum) or ink containing metals (not shown). The interconnection of all the components can be achieved with the interconnects 30 discussed above.

Flexible strap 301 further includes at least two carrier connection pads 305 and 306. The carrier connection pads 305 and 306 are used to couple the flexible strap 301 to the receiving substrate 310 (see below). The carrier connection pads 305 and 306 are made out of conductive materials. A conductive adhesive can be used to couple the flexible strap 301 to the receiving substrate 310 thereby establishing electrical interconnections for all of the functional components from the flexible strap 301 to those from the receiving substrate 310. In another embodiment, the methods called cold swaging or ultrasonic welding which, are well practiced in the field, can be used to couple the flexible strap 301 to the receiving substrate 310.

In one embodiment, the receiving substrate 310 includes an antenna 311 as a functional component. The receiving substrate 310 may be flexible and made out of some low cost plastic or some other suitable material for the particular application. The receiving substrate 310 is preferably planar. The antenna 311 may be loops of wire attached to the receiving substrate 310. The antenna 311 may also be made out of screen printed conductors such as silver, carbon, or metal that is coupled to the receiving substrate 310 that has been etched with patterns to receive the antenna material. The antenna 311 may also be made out of laminated drawn foil that has an adhesive containing layer which enables the antenna to be coupled to the receiving substrate 310 in any particular pattern, for instance, loops. At each end of the loops of the antenna 311, there is a receiving connection pad, in this embodiment, receiving connection pads 312 and 313. The receiving connection pads 312 and 313 are also made out of conductive materials to establish the conductive connection for all of the functional components from the receiving substrate 310 to those from the flexible strap 301.

Figure 5:
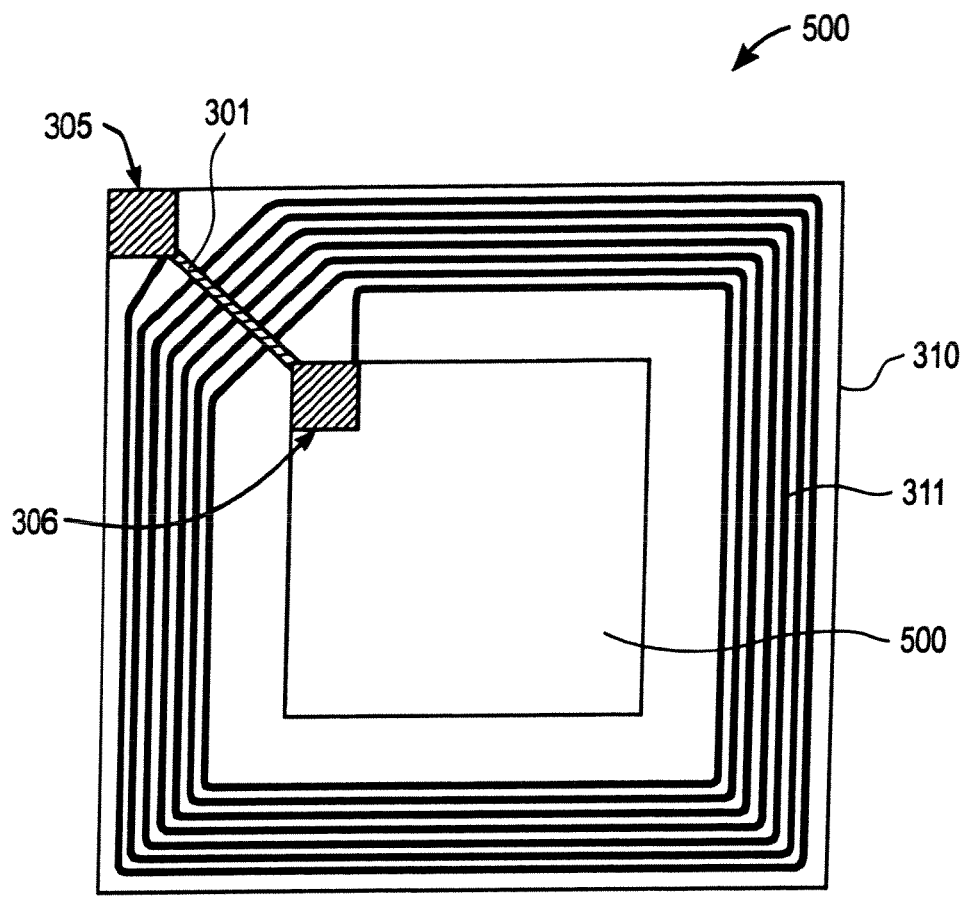
FIGS. 5-6 illustrate of an exemplary embodiment of an RFID tag according to the present invention.

In order to complete the circuitry of the antenna 311, the flexible strap 301 is coupled to the receiving substrate 310. The coupling of the flexible strap 301 and the receiving substrate 310 is achieved through the attachment of the carrier connection pads 305 and 306 to the receiving connection pads 312 and 313 as shown by arrows A and B. The flexible strap 301 can cross over at least one conducting material. Here, the flexible strap 301 crosses the loops of the antenna (FIG. 5). In one example, a conductive adhesive is used to couple all of the carrier connection pads to the receiving connection pads.

It will be appreciated that the flexible substrate 310 may have other functional components or other circuitries, instead of or in addition to the antenna 311. For instance, another functional component like blocks 1 which may have circuitries designed to drive display pixel electrodes, to draw energy source, to sense external inputs, or to transfer data. In one embodiment, the total carrier connection pads (such as 305 and 306) is only two even if there are multiple functional components in the flexible strap 301.

Figure 4A:
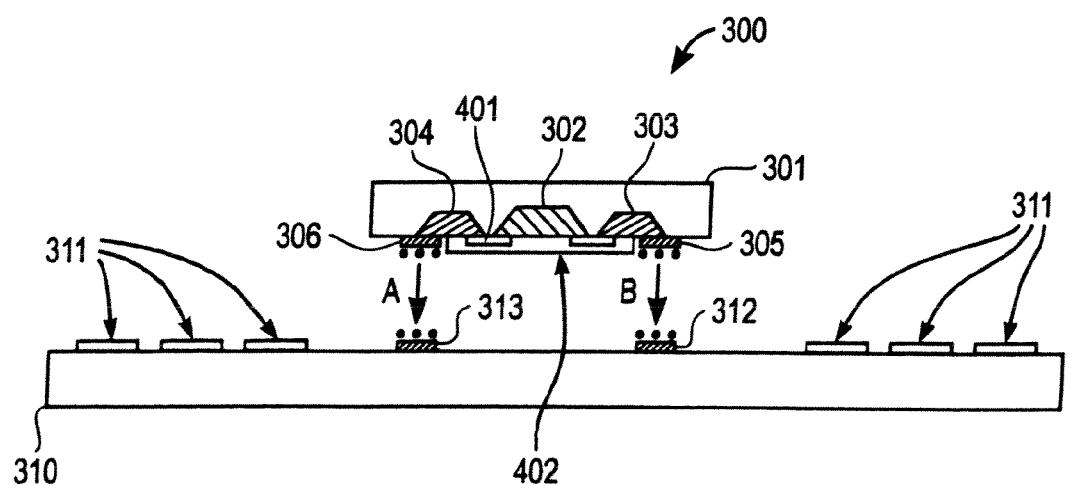
FIG. 4A illustrates a cross-sectional view of an exemplary embodiment of an RFID tag according to the present invention.

FIG. 4A illustrates the cross-sectional view of the embodiment described in FIG. 3. This figure, however, shows in details that there is preferably an insulation layer 402 between the metal wires 401 that interconnect all of the components on the flexible strap 301 and the antenna 311 on the receiving substrate 310. The insulation layer 402 is a dielectric material that serves to electrically isolate the metal wires on flexible substrate 301 and the antenna 311 on the receiving substrate 310. Contacting the metal wires 401 with the antenna or the electrical circuitry will short-circuit the antenna or other the electrical circuitry.

Figure 4B:
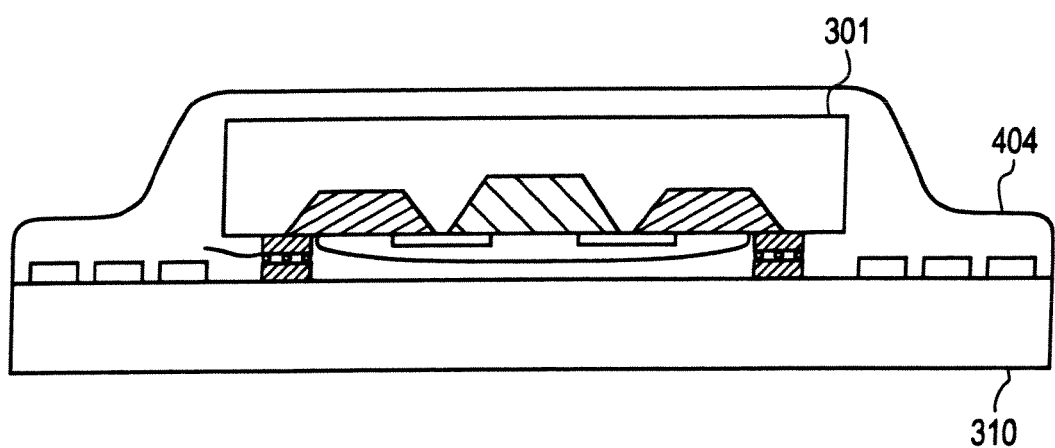
FIG. 4B illustrates a cross-sectional view of an exemplary embodiment of an FR ID tag wherein the flexible strap has an additional cover.

In addition, the flexible strap 301 can be covered with a protected layer 404 for extra protection (FIG. 4B). The protected layer 404 can be made out of any flexible material such as polymer or plastic. The protected layer 404 can also be transparent or opaque.

The method of fabricating the electronic devices described in FIGS. 3, 4A and 4B can be applied to make a wide range of other electronic devices. The small flexible strap 301 with blocks 1 can be made to be readily available components that can be used for any particular purpose. For example, the flexible strap 301 can be used in the fabrication of display components, micro-electro-mechanical structural elements, or generally, an assembly of sensors or actuators or an assembly of circuit elements. Thus, devices such as flexible antennas, other sensors, detectors, or an array of circuit elements may be fabricated using one of the embodiments of the inventions.

Another advantage of the present invention is manufacturing of electronic devices that are having radically different feature sizes to interface or integrate with one another. In order to lower the cost of making electronic devices, blocks 1 are made with very small silicon or other materials suitable for carrying a circuit. Making blocks 1 small, (in the order of tens of micrometers in dimension) optimizes the expensive technology and the expensive media materials necessary (e.g., silicon wafer) to fabricate these blocks 1. (See U.S. patent application Ser. No. 09/251,220 reference above). Making the blocks 1 small also enables the functional components to be small, thus, saving material cost as well as the processing cost. Furthermore, small blocks 1 enable small packaging of the silicon material which means more of blocks 1 can be produced at a higher rate with less materials.

However, integrating these functional micro blocks 1 into coarse materials such as display components, antenna card, or other large electronic components, present problems of interfacing or integrating materials of radically different feature sizes. For instance, the substrate of a display is typically much bigger than that of the blocks 1; or the substrate of an antenna in an RFID tag is likewise much bigger than that of the blocks 1. Integrating radically different feature size materials together is inherently wasteful of areal space, for instance, leaving die area typically useful for essential components unused. In yet another example, electronic components of high densities such as transistors, when integrating with other large components, also need to have high densities to minimize waste. Thus, when making large electronic devices, the functional components are often large. This is wasteful to expensive material.

In the present inventions, flexible strap 301 may be viewed as an interposer which is an intermediate that bridge functional components of radically different densities together without the waste of materials. With the present inventions, the functional component that is the most expensive to fabricate can be made like the blocks 1 which is very small in dimension. The blocks 1 are then deposited into the flexible strap 301, and then integrated with another functional components that can be made out of a cheaper material or technology. More importantly, we can optimize the most expensive technology, i.e., the interconnecting technology, where it is needed. Using the embodiments according to the present invention, the expensive interconnecting technology, (e.g., FSA) is only used in making the flexible strip 301 while the making of the antenna, for example, can be achieved using a lower cost interconnecting technology. The expensive processes and materials are thus optimized.

The following example illustrates the size differences for an electrical device manufactured with the methods described above. The functional block 14 has a total size of 350 μm×500 μm (width×length) with a design feature size or design rule of 0.5 μm. The flexible strap 301 as a total size of 1.5 mm×10 mm with a design feature size of 20 μm. And, the receiving substrate 311 has the total size of 20 mm×50 mm with the design feature size of 250 μm. The design feature size or design rule can be thought of as a density for each of the components. The embodiments discussed therefore, enable the integrating and the interfacing of radically different density electronic devices to each other without wastes of expensive material and technology.

FIG. 5 illustrates an example of an RFID tag 500 made using the method described in FIGS. 3, 4A and 4B. Current art includes RFID tags, which are small, nevertheless, contains very limited information due to the size constraint. Also, current RFID tags are inflexible because the IC packagings are rigid and large. Storing more information also means that the RFID tag would have to have more functional components and as a result, require more interconnections among different functional components. Placing these many functional components on the same substrate is overly expensive and complex, not to mention increasing the chance for short circuit in the system. For a flexible and thin RFID tag, it is desirable to have the silicon integrated circuitry (IC) be small and thin. The blocks 1 described above may be used to contain the IC which can then be incorporated into the RFID tag 500. The RFID tag 500 can be placed on products such as store merchandise as a way to label, identify, and track these products.

Figure 6:
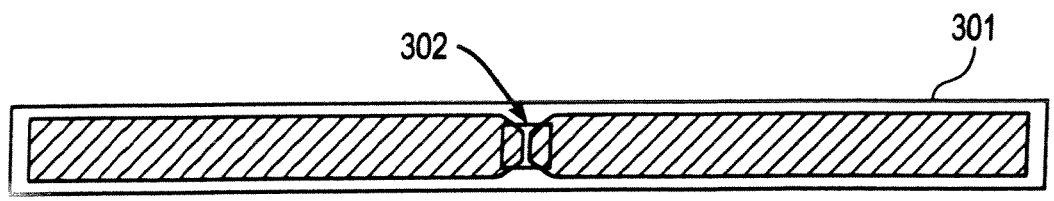

FIG. 5 illustrates an example of depositing the all of the functional components except for the antenna 311 onto the flexible strap 301 and using the flexible strap 301 to bridge the antenna 311. FIG. 6 is an enlarged view of the flexible strap that is used in the RFID tag 500.

In a conventional method, the antenna 311 would be deposited on receiving substrate 310, typically a thick material. The functional components (not shown) would then be deposited in area 500. Some conductive material would interconnect the functional components to each other. Then, a strap would bridge one side of the loops of the antenna 311 to the other side of the loops of. The strap has no function other than to complete the circuit for the antenna 311. Under the current art if there is a defective functional components, that will not be detected until the whole fabrication of the RFID tag 500 is completed. When that happens, materials are wasted since the whole RFID tag is discarded. Furthermore, the alignment of these functional components makes the assembly process complicated and expensive.

In the present embodiment, the functional components would be placed in the flexible strap 301 and not area 500. The flexible strap 301 would serve to bridge one side of the antenna 311 to the other side of the antenna 311. Furthermore, the flexible strap 301 would carry the functional components that have particular functions, for instance, to receive power for the operation of the RFID tag 500 or to send information to a base station of the RFID tag base 500.

By using the embodiments of FIGS. 3-6 a low cost technology such as screen-printing can be used to produce large area elements such as the antenna 311. In one example, the antenna 311 may be printed in massive quantity on some low cost substrate and using a process that requires less rigorous alignment. The functional component such as the blocks 1 to drive the antenna 311 or to send the data from the RFID tag 500, may be as described in U.S. patent application Ser. No. 09/251,220 mentioned above. The blocks 1 are then integrated into the carrier substrate 12 with a high precision and more expensive technology such as the fluidic self-assembly. Thus, the small flexible strap 301 can be used to carry all of the essential components that are expensive to manufacture. The expensive interconnecting technology is optimized in that all of the essential components are packaged into the flexible strip 301 which is then coupled to the antenna that would be made out of a lower cost interconnecting technology.

Another example using the flexible strap 301 to integrate with other functional components to make electrical device involves the making of a signage display. FIGS. 7A-7B illustrate a general view of a signage display utilizing the flexible strap 301 of the present invention. The display system 700 includes a flexible strap 701, which is similar to the flexible strap 301 described above, a top electrode layer 710, a viewable area 720, and a backplane layer 730.

In a conventional technology, a general display system have its electronic circuit elements, such as row or column driver circuits, attached to flexible circuits such as TAB tape. The assembly is then attached to the LCD on one side and a PC board on the other. An additional set of circuits is usually added to the second glass or plastic layer. In a passive matrix LCD, the driver circuits are attached to each glass or plastic substrate; in an active matrix LCD, the driver circuits are attached to two or four edges on only one of the glass or plastic substrates. These drive circuits provide the electrical control signals and data required to form an image on the LCD. While an LCD is used for the example, the same principles apply to other display media such as plasma, electroluminescence, electrophoretic, electrochromic, and the like.

Unlike the conventional method, in one embodiment of the present invention, the flexible strap 701 includes at least one integrated circuit which is embedded in a functional block 702. The functional block 702 is manufactured as one of the blocks 1 discussed above. The functional block 702 may be manufactured according to the method disclosed in the U.S. patent application Ser. No. 09/671,659, entitled "Display Devices and Integrated Circuits" which was filed on Sep. 27, 2000, by inventors Roger Green Stewart, et. al. This patent application is incorporated by reference herein.

In this embodiment, the functional block 702 is interconnected to eight output pads, 703*a*, 703*b*, 703*c*, 703*d*, 703*e*, 703*f*, 703*g*, and 703*h*. Each of these output pads is responsible for driving a particular segment of the display system. And, each of the segment displays a particular image of the signage display. The functional block 702 may also include an output pad 705 for a ground signal, or other necessary function for an integrated circuit.

Each of these output pads 703a, 703b, 703c, 703d, 703e, 703f, 703g, and 703h functions like those carrier connection pads 305 and 306. In essence, these pads establish electrical connections between the integrated circuit included in the functional component 702 and the functional components on the display. In one example, the output pad 703g may be used to establish the electrical connection with the portion of the top electrode layer 710 that is responsible for controlling the "Jones Product" segment of the display system 700. Similarly, the output pad 703e may be used to establish the electrical connection with the portion of the top electrode layer 710 that is responsible for controlling the "Creations" segment of the display system 700. In other words, the output pads 703a, 703b, 703c, 703d, 703e, 703f, 703g, and 703h all establishes electrical connections with the top electrode layer 710 that in turn drives the segments of the display system 700.

In a preferred embodiment, the flexible strap 701 is coupled to the backplane layer 730 of the display system 700. To affix the flexible strap 701 to the display system 700, a thin layer of nonconductive adhesive may be coated over the carrier substrate 704. In one example, the adhesive would be coated over the all of the area that do not have the output pads 703a, 703b, 703c, 703d, 703e, 703f, 703g, and 703h. Thus, the flexible strap 701 may be affixed to a surface such as the backplane layer 730 while the electrical function of the output pads 703a, 703b, 703c, 703d, 703e, 703f, 703g, and 703h would not be blocked by the adhesive layer. These outputs pads therefore, would be able to establish the necessary electrical connections with the top electrode layer 710.

In another embodiment, the output pads 703a, 703b, 703c, 703d, 703e, 703f, 703g, and 703h are all made out of conductive adhesive such that when affixed to the top electrode layer 701, these pads can establish both the mechanical as well as the electrical contact to the electrode layer 701.

It will be appreciated that the number of the output pads depends on the particular applications or the displays. The number of the output pads may be more or less than eight output pads for each functional component block. Further, larger signage display can also be made using the examples discussed above. For instance, when the signage display requires more segments or portions for larger images, more functional blocks 1 can be incorporated into the flexible strap 701.

In a preferred embodiment, the flexible straps 701a, 701b, 701c, and 701d are coupled to the backplane layer 730 of the display system 700-2. A thin layer of nonconductive adhesive may be coated over the carrier substrate 704a, 704b, 704c, and 704d. The adhesive would be coated over the all of the area that do not have the output pads. Thus, the flexible straps 701a, 701b, 701c, and 701d may be affixed to the backplane layer 730 and the adhesive layer would not block the electrical function of the associated output pads. These output pads therefore, would be able to establish the necessary electrical connections with the top electrode layer 710 for the display 700.

Figure 8A:
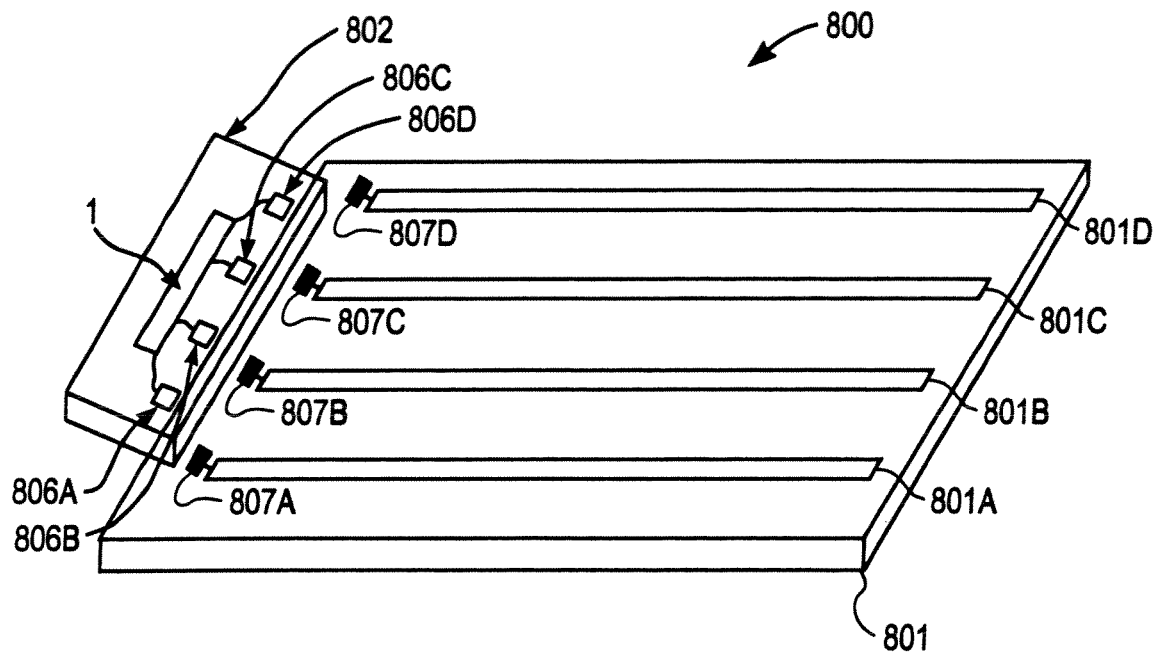
FIGS. 8A-B illustrate an exemplary display of the present invention.
Figure 8B:
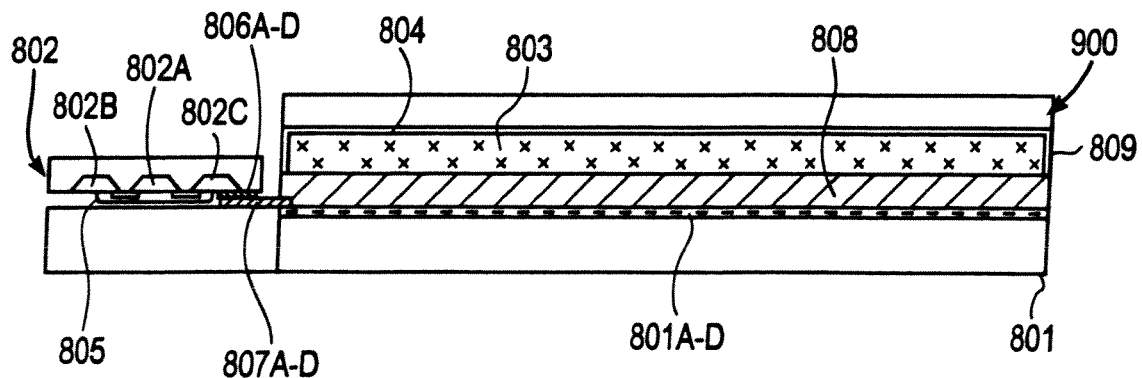

FIG. 8A shows an overview of a display system 800, which can be the signage display 700 in FIGS. 7A-7B. FIG. 8A illustrates a planar view of the display system 800 and FIG. 8B illustrates a cross-sectional view of the display system 800. The display system 800 comprises of a carrier substrate 802, which includes integrated circuits, for example, block 1, for driving the display. In one embodiment, carrier substrate 802 is flexible and small. For example, the carrier substrate 802 is considerably smaller than the receiving substrate 801.

The carrier substrate 802 is coupled to pixel electrodes 801A-801D on a receiving carrier substrate 801 through the couplings of connection pads, for instance connection pad 806A to 807A, connection pad 806B to 807B, connection pad 806C to 807C, and connection pad 806D to 807D. These couplings would enable the integrated circuit to drive the pixel electrodes 800A-800D in the display system 800. The display system 800 also comprises insulation layer, display material, and counter electrode or cover glass electrode. They are discussed in details below.

FIG. 8B shows a cross-sectional view of the display system 800 according to one embodiment of the present invention. The display system 800 includes a carrier substrate 802, which has receiving openings for functional components such as integrated circuits 802A, 802B, and 802C. The carrier substrate 802 is made using the embodiment discussed above for flexible strip 301 in FIG. 3. Similar to the embodiments discussed above, the functional components once coupled to the carrier substrate are recessed within the carrier substrate and below the native surface of the carrier substrate. The carrier substrate 802 also includes carrier connection pads 806A-D, which establish mechanical as well as electrical connections with the receiving substrate 801.

The receiving substrate 801 can be made using a coarse technology and some coarse materials for making signage display. The display system 800 includes a receiving substrate 801 which further comprising pixel electrodes 801A-801D. The receiving substrate 801 also comprises receiving connection pads 807A-D. The receiving connection pads 807A-D are interconnected with the pixel electrodes 801A-D and thus, when coupled to the carrier connection pads 806A-D, establish mechanical as well as electrical connections with the carrier substrate 802. Similar to the embodiments discussed above, the carrier substrate 802 can cross over at least one electrical interconnection on the receiving substrate 801 without damaging or shorting the pixel electrodes on the receiving substrate 801. The carrier connection pads 806A-D are also interconnected with the ICs 802A, 802B and 802C. When all the necessary connections are established, the ICs will then drive the pixel electrode of the signage display 800.

The integrated circuits 802A, 802B, and 802C are display drivers in one embodiment. When proper mechanical and electrical connections are established, these integrated circuits will drive the pixel electrodes in the display system 800.

The carrier substrate 802 may be made out of a metal, foil, or flexible plastic material. An insulating layer 805 maybe attached to a top surface of the carrier substrate 802. In such an example, the insulating layer 805 has a plurality of openings through which electrical interconnections can be established (e.g., vias through which carrier connection pads 806A-D interconnect with receiving connection pads 807A-D).

A layer 808 may be provided on top of the pixels electrodes and the conductive signals electrodes in order to insulate these parts from the display media material 803 which may be a nematic liquid crystal, an electrophoretic display material, a polymer dispersed liquid crystal material, an organic light emitting diode material, a cholesteric liquid crystal material, an electrochromic material, a particle-based material, a thin-film electroluminescent material, or other known display materials which can be driven by pixel electrodes or other types of display materials which may be controlled by electrodes. A counter electrode or cover glass electrode 804 is typically a thin layer of transparent indium tin oxide which is deposited upon a cover glass 900 which is transparent. Spacers 809 are attached to the layer 808 and to the cover glass 900 to provide a desired spacing between the counter electrode 804 and the layer 808.

It can be seen from FIGS. 8A-8B that carrier substrate 802 acts as an interposer that integrates or interfaces two radically different feature sized electrical devices to each other (e.g., integrating the micro display drivers to the large signage display). The methods described above allow the ICs to be manufactured in the order of sub-micrometer density. The methods above then enable the integration of the submicrometer ICs to a much coarser and larger display. Using this method, the ICs do not need to be made large in order to facilitate the coupling of the ICs into a large display panel. Expensive materials and technologies are thus optimized. This provides for greatly reduced manufacturing costs and improved yield and efficiency in the manufacturing process.

It will be appreciated that the display system 800 illustrates one exemplary embodiment of making display according the present invention. Displays according to the present invention may be used to fabricate displays with liquid crystals, polymer dispersed liquid crystal, electroluminescent (EL) materials, organic light emitting diodes (OLEDs), up and down-converting phosphor (U/DCP), electrophoretic (EP) materials, or light emitting diodes (LEDs).

Fabrication of display panels is well known in the art. Display panels may be comprised of active matrix or passive matrix. Active matrix panels and passive matrix panels may be either transmissive or reflective.

Liquid crystal displays (LCDs), for example, display system 800, can have an active-matrix backplane in which thin-film transistors are co-located with LCD pixels. Flat-panel displays employing LCDs generally include five different components or layers. A light source, a first polarizing filter that is mounted on one side of a circuit panel on which the thin-film transistors are arrayed to form the pixels such as pixels 801A-801D. A filter plate containing at least three primary colors are aligned with the pixels (for color displays), and a second polarizing filter. A volume between the circuit panel and the filter plate is filled with liquid crystal material, for instance, layer 803. This material will rotate the polarized light when an electric field is applied between the thin-film transistor circuit panel and a electrodes affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. U/DCP and EP displays are formed in similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the light emitting device.

The displays discussed above are particularly useful for signage displays used in airport terminal, commercial signage display, or billboard displays. These types of displays are typically large and the manufacturing of the display panel is relatively cheap due to the fact that they employ a less rigorous technology with large feature sizes. However, the integrated circuit needed to drive these types of displays are expensive to make and have small feature sizes. The method of this invention allows the manufacturers to make the IC very small and still connect them to the large signage display.

The flexible strap 301 is particularly crucial for integrating and interfacing electronic devices of radically different feature sizes. Integrating and interfacing the blocks 1 to a coarse and large display requires the blocks 1 to be large enough in order for the integrating and the interfacing to be feasible. However, to minimize cost in making the IC, the blocks 1 are very small in feature size, for example, the blocks 1 have a densities in the vicinity of sub-micrometer. The signage display is typically in the order of 100-250 micrometer in density. One way to efficiently integrating and interfacing the signage display to the blocks 1 is through using the carrier substrate discussed above for the flexible strap 301.

The following example illustrates the size differences for a signage display manufactured with the methods described above. The functional block 1 has a total size of 350 μm×500 μm (width×length) with a design feature or design rule of 0.5 μm. The carrier substrate 802 has a total size of 10 mm×10 mm with a design feature of 20 μm. And, the receiving substrate 801 has the total size of 20 in×50 in with the design feature of 250 μm. The carrier substrate is thus about one order of magnitude different from the functional block 1 and an order of magnitude different from the signage display. The embodiments discussed therefore, enable the integrating and the interfacing of electronic devices having radically different density, feature size, and total size, to each other without wastes of expensive material and technology.

An electrical device made according to the embodiments of the present invention also has an advantage of being multi-feature-size. For instance, the carrier substrate 12 may have a feature size (design rule) that is at least five times larger than the block 1. The carrier substrate 12 also has a feature size that is at least five times smaller than the receiving substrate 310.

The functional block 1 can be packaged in a flexible strap, the carrier substrate discussed above. Flexible packaging also means that these signage displays can be made flexible which is extremely useful for many purposes. It also means that the sign can be very thin, owing to the thin dimension of the flexible strap.

An electrical device made according to the embodiments of the present invention also has all of the electrical circuitry in the functional components and the necessary interconnections, (e.g., the first interconnection and the second interconnection) are all essentially in coplanar to each other. As can be seen from FIG. 3 and FIG. 5, when the whole device is assembled together, all of the components mentioned above are essentially in one plane field. Alternatively, all of the electrical circuitry in the functional components and the necessary interconnection, (e.g., the first interconnection and the second interconnection) each forms a plane that is separated from one another by less than ten micrometers. Therefore the planar electrical circuitry on the functional component, the planar first interconnection on the carrier substrate, and the planer second interconnection on the receiving substrate are all coplanar with each other such that their planes are typically separated by less than 10 micrometers.

We claim:

1. A method of making an electronic assembly comprising:
   providing a strap from a first web of flexible material, the strap comprising:
      a functional component, the functional component being a radio frequency identification (RFID) flip chip;
      a portion of the flexible material; and
      first and second connection pads on the flexible material;
   providing an antenna on a flexible substrate;
   detecting for a defective functional component of the strap;
   attaching the strap to the flexible substrate if a defect is not detected during the detecting,
   wherein the antenna is electrically coupled to the RFID flip chip by the first and second connection pads, and
   wherein the strap is smaller than the antenna.

2. The method of claim 1 furthering comprising printing the antenna on the flexible substrate.

3. The method of claim 1 wherein the attaching is by ultrasonic welding.

4. The method of claim 1 wherein the attaching is by cold swaging.

5. The method of claim 1 wherein the attaching uses a conductive adhesive.

6. The method of claim 1 wherein the flexible material is opaque.

7. The method of claim 1 wherein the flexible material is transparent.

8. The method of claim 1 wherein the flexible material is polyester terephthalate.

9. The method of claim 1 wherein the flexible material is polyether sulfone.

10. The method of claim 1 wherein the flexible material is polyimide.

11. The method of claim 1 wherein the flexible material is polyetherimide.

12. A method of making an electronic assembly comprising:
    providing a strap from a first web of flexible material, the strap comprising:
       a functional component, the functional component being a radio frequency identification (RFID) chip configured for fluidic self assembly;
       a portion of the flexible material; and
       first and second connection pads on the flexible material;
    providing an antenna on a flexible substrate;
    detecting for a defective functional component of the strap;
    attaching the strap to the flexible substrate if a defect is not detected during the detecting,
    wherein the antenna is electrically coupled to the RFID chip by the first and second connection pads, and
    wherein the strap is smaller than the antenna.

13. The method of claim 12 furthering comprising printing the antenna on the flexible substrate.

14. The method of claim 12 furthering comprising adhering the antenna to the flexible substrate with an adhesive.

15. The method of claim 12 wherein the attaching is by ultrasonic welding.

16. The method of claim 12 wherein the attaching is by cold swaging.

17. The method of claim 12 wherein the attaching uses a conductive adhesive.

18. The method of claim 12 wherein the flexible material is opaque.

19. The method of claim 12 wherein the flexible material is transparent.

20. The method of claim 12 wherein the flexible material is polyester terephthalate.

21. The method of claim 12 wherein the flexible material is polyether sulfone.

22. The method of claim 12 wherein the flexible material is polyimide.

23. The method of claim 12 wherein the flexible material is polyetherimide.

* * * * *